United States Patent
Lim et al.

(10) Patent No.: US 11,245,192 B2
(45) Date of Patent: Feb. 8, 2022

(54) CHIP ANTENNA

(71) Applicant: Samsung Electro-Mechanics Co., Ltd., Suwon-si (KR)

(72) Inventors: Dae Ki Lim, Suwon-si (KR); Young Sik Hur, Suwon-si (KR); Kyu Bum Han, Suwon-si (KR); Ju Hyoung Park, Suwon-si (KR); Myeong Woo Han, Suwon-si (KR); Jeong Ki Ryoo, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/002,006

(22) Filed: Aug. 25, 2020

(65) Prior Publication Data

US 2021/0313694 A1 Oct. 7, 2021

(30) Foreign Application Priority Data

Apr. 2, 2020 (KR) ........................ 10-2020-0040210

(51) Int. Cl.
*H01Q 9/04* (2006.01)
*H01Q 1/02* (2006.01)
*H01Q 1/22* (2006.01)

(52) U.S. Cl.
CPC .............. *H01Q 9/045* (2013.01); *H01Q 1/02* (2013.01); *H01Q 1/2283* (2013.01)

(58) Field of Classification Search
CPC ......... H01Q 1/02; H01Q 1/2283; H01Q 9/045
See application file for complete search history.

(56) References Cited

U.S. PATENT DOCUMENTS

| | | | |
|---|---|---|---|
| 10,700,024 B2 * | 6/2020 | So | H01L 24/82 |
| 11,133,592 B2 * | 9/2021 | Kang | H01Q 1/2283 |
| 2016/0172317 A1 * | 6/2016 | Tsai | H01L 24/33 257/428 |
| 2017/0125895 A1 | 5/2017 | Baks et al. | |
| 2019/0207304 A1 * | 7/2019 | Kim | H01Q 9/0414 |
| 2020/0303805 A1 * | 9/2020 | Ryoo | H01Q 21/28 |
| 2020/0328518 A1 * | 10/2020 | Park | H01Q 5/40 |
| 2020/0328530 A1 * | 10/2020 | Park | H01Q 1/2283 |
| 2021/0151853 A1 * | 5/2021 | Park | H01Q 1/243 |
| 2021/0151899 A1 * | 5/2021 | Park | H01Q 21/065 |

(Continued)

FOREIGN PATENT DOCUMENTS

| | | |
|---|---|---|
| KR | 10-0586936 B1 | 6/2006 |
| KR | 10-0805028 B1 | 2/2008 |

(Continued)

*Primary Examiner* — Lam T Mai

(74) *Attorney, Agent, or Firm* — NSIP Law

(57) ABSTRACT

A chip antenna includes: a first dielectric layer; a second dielectric layer upwardly spaced apart from the first dielectric layer; a patch antenna pattern disposed on the second dielectric layer; a feed via extending through the first dielectric layer; a feed pattern disposed between the first and second dielectric layers, electrically connected to the feed via, and spaced apart from the patch antenna pattern; and an adhesive layer adhered to the first and second dielectric layers. The adhesive layer includes a cavity surrounding the feed pattern between the first and second dielectric layers and; and a vent disposed between the cavity and an external side surface of the adhesive layer.

24 Claims, 15 Drawing Sheets

(56) References Cited

U.S. PATENT DOCUMENTS

2021/0242595 A1\* 8/2021 Kim .................... H01Q 1/2283
2021/0242892 A1\* 8/2021 Jo .......................... H04B 1/04
2021/0242896 A1\* 8/2021 Kim ................... H01L 25/0652

FOREIGN PATENT DOCUMENTS

KR          10-1118332 B1    3/2012
WO    WO 2008/032960 A1    3/2008

\* cited by examiner

CHIP ANTENNA

CROSS-REFERENCE TO RELATED APPLICATIONS

This application claims the benefit under 35 U.S.C. § 119(a) of Korean Patent Application No. 10-2020-0040210 filed on Apr. 2, 2020 in the Korean Intellectual Property Office, the entire disclosure of which is incorporated herein by reference for all purposes.

BACKGROUND

1. Field

The following description relates to a chip antenna.

2. Description of Related Art

Mobile communications data traffic has increased on an annual basis. Various techniques have been actively developed to support rapidly increasing data in wireless networks in real time. For example, conversion of Internet of Things (IoT)-based data into contents, augmented reality (AR), virtual reality (VR), live VR/AR linked with SNS, an automatic driving function, applications such as a sync view (transmission of real-time images from a user's viewpoint using a compact camera), and the like, may require communications (e.g., 5G communications, mmWave communications, and the like) which support the transmission and reception of large volumes of data.

Accordingly, there has been a large amount of research on mmWave communications including 5th generation (5G), and research into the commercialization and standardization of an antenna apparatus for implementing such communications has been increasingly conducted.

An RF signal of a high frequency band (e.g., 24 GHz, 28 GHz, 36 GHz, 39 GHz, 60 GHz, and the like) may be easily absorbed and lost while being transferred, such that communications quality may degrade. Thus, an antenna for communications based on a high frequency band may need a technical approach different from that of a general antenna technique, and development of a special technique such as securing of antenna gain, integration between an antenna and an RFIC, securing of effective isotropic radiated power (EIRP), and the like, may be required.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a chip antenna includes: a first dielectric layer; a second dielectric layer upwardly spaced apart from the first dielectric layer; a patch antenna pattern disposed on the second dielectric layer; a feed via extending through the first dielectric layer; a feed pattern disposed between the first and second dielectric layers, electrically connected to the feed via, and spaced apart from the patch antenna pattern; and an adhesive layer adhered to the first and second dielectric layers. The adhesive layer includes a cavity surrounding the feed pattern between the first and second dielectric layers and; and a vent disposed between the cavity and an external side surface of the adhesive layer.

The adhesive layer may include a polymer having an adhesiveness higher than an adhesiveness of a dielectric material of the first and second dielectric layers.

The external side surface of the adhesive layer, a side surface of the first dielectric layer, and a side surface of the second dielectric layer may form a single plane.

A width of the vent may be shorter than a width of a structure surrounding the cavity on the adhesive layer.

The vent may include a plurality of vents, and at least two vents among the plurality of vents may be disposed to overlap each other in a venting direction of the at least two vents.

The patch antenna pattern may have a quadrangular shape with chamfered corners, and a side of the quadrangular shape may be disposed to be diagonal to a side of the cavity.

The chip antenna may further include: a plurality of coupling patterns disposed on the second dielectric layer and arranged to at least extend adjacent to sides of the quadrangular shape.

The patch antenna pattern and the plurality of coupling patterns may be disposed on a same level on an upper surface of the second dielectric layer.

The patch antenna pattern may be disposed on an upper surface of the second dielectric layer.

The feed pattern may extend in a diagonal direction with respect to a side of the cavity.

At least a portion of the cavity may include air, and at least a portion of the feed pattern may be plated.

The chip antenna may further include: a soldering pattern disposed on a lower surface of the first dielectric layer and surrounding the feed via.

In another general aspect, a chip antenna includes: a first dielectric layer; a feed via extending through the first dielectric layer; a second dielectric layer upwardly spaced apart from the first dielectric layer; a patch antenna pattern disposed between the first and second dielectric layers and electrically connected to the feed via; and an adhesive layer adhered to the first and second dielectric layers. The adhesive layer includes: a cavity surrounding the patch antenna pattern between the first and second dielectric layers; and a vent disposed between the cavity and an external side surface of the adhesive layer.

The adhesive layer may include polymer having an adhesiveness higher than an adhesiveness of a dielectric material of the first and second dielectric layers.

The external side surface of the adhesive layer, a side surface of the first dielectric layer, and a side surface of the second dielectric layer may form a single plane.

A width of the vent may be shorter than a width of a structure surrounding the cavity on the adhesive layer.

The vent may include four or more vents. The patch antenna pattern may have a quadrangular shape with chamfered corners, and the chamfered corners may be disposed to overlap corresponding vents, among the four or more vents, in a venting direction of the corresponding vents.

The patch antenna pattern may have a quadrangular shape having chamfered corners, and a side of the quadrangular shape may be disposed to be diagonal to a side of the cavity.

At least a portion of the cavity may include air, and at least a portion of the patch antenna pattern may be plated.

The chip antenna may further include: a soldering pattern disposed on a lower surface of the first dielectric layer and surrounding the feed via.

In another general aspect, a chip antenna includes: a first dielectric layer; a second dielectric layer disposed above the first dielectric layer; a cavity disposed between the first dielectric layer and the second dielectric layer; a patch antenna pattern disposed on the second dielectric layer; a feed pattern disposed in the cavity and configured to feed a signal to or from the patch antenna pattern in a non-contact manner; an adhesive layer attaching the first dielectric layer and the second dielectric layer to each other, and surrounding the cavity; and a vent extending from the cavity to an external side surface of the adhesive layer.

The adhesive layer may have a dielectric constant that is lower than a dielectric constant of the first dielectric layer and a dielectric constant of the second dielectric layer.

The patch antenna pattern may not extend laterally beyond the cavity.

The patch antenna pattern may have a quadrangular shape with chamfered corners, and the vent may be aligned with one of the chamfered corners.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
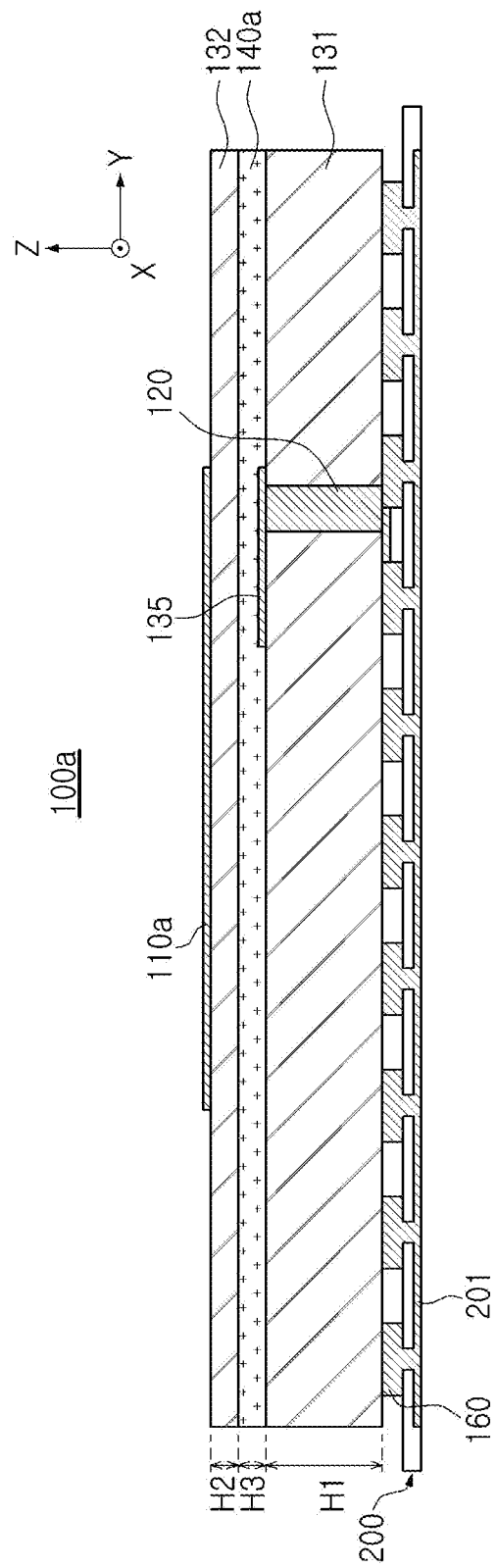
FIG. 1A is a lateral view illustrating a dispositional level of each element in a chip antenna, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2A:
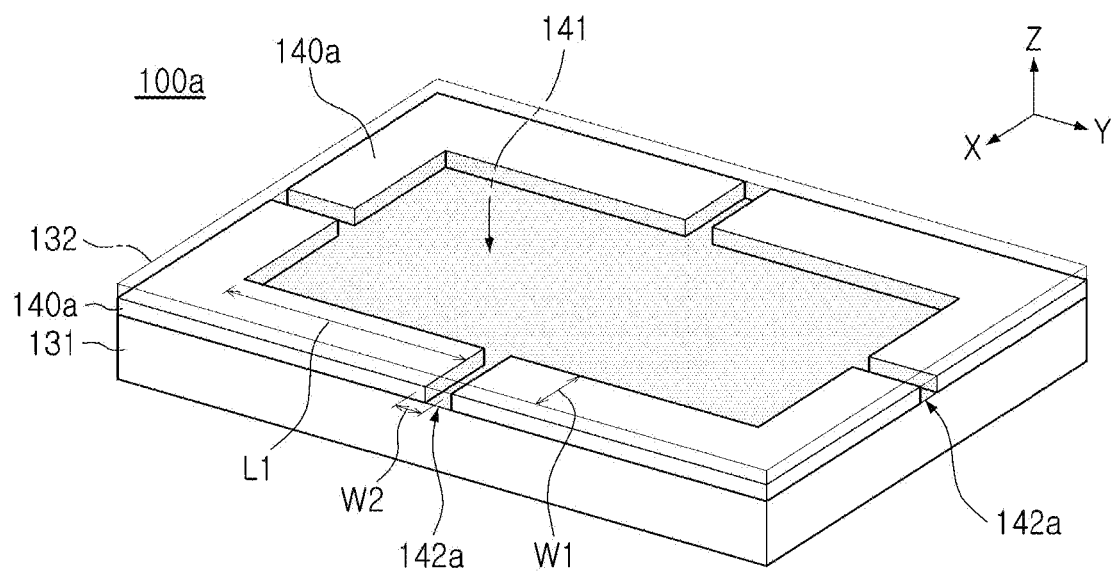
FIG. 2A is a perspective view illustrating an adhesive layer and a vent of the chip antenna of FIG. 1A, according to an embodiment.
Figure 2B:
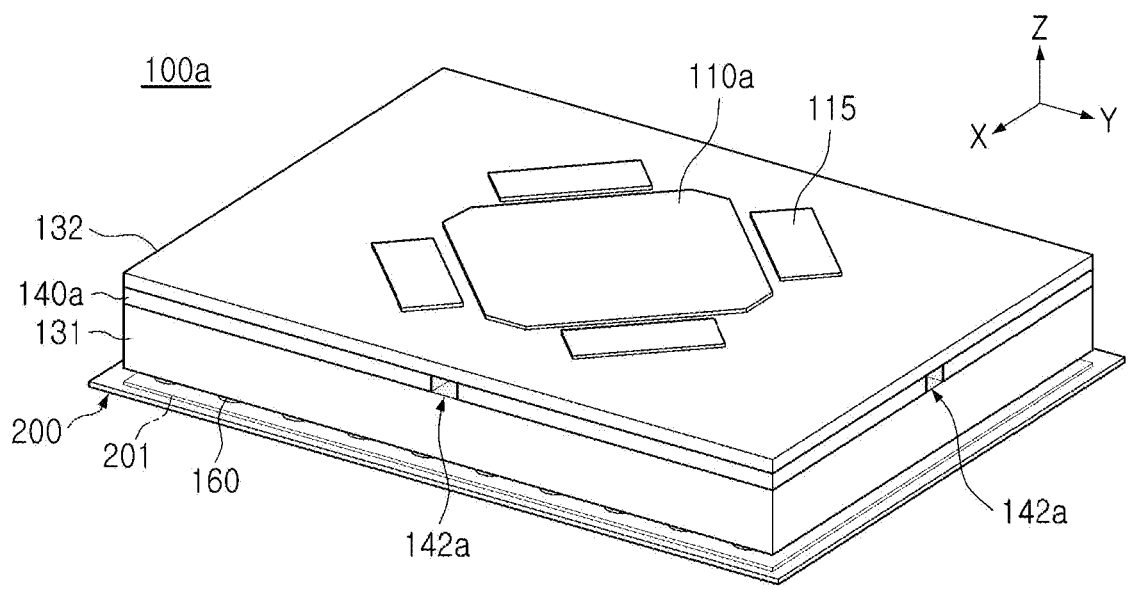
FIG. 2B is a perspective view illustrating an appearance of the chip antenna of FIG. 1A, according to an embodiment.
Figure 2C:
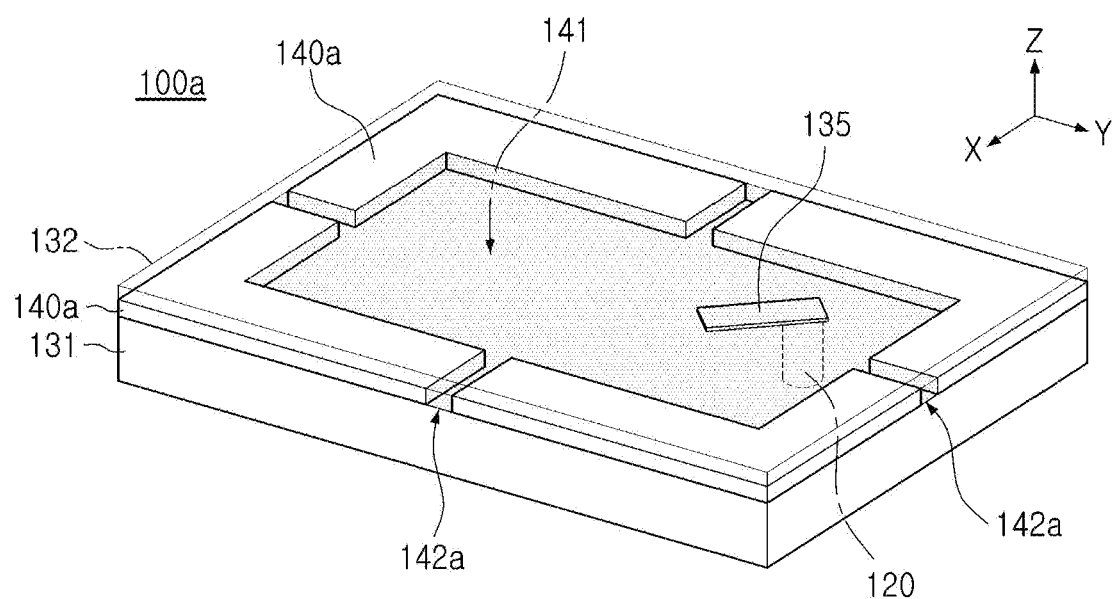
FIG. 2C is a perspective view illustrating a feed pattern and a feed via of the chip antenna of FIG. 1A, according to an embodiment.
Figure 5A:
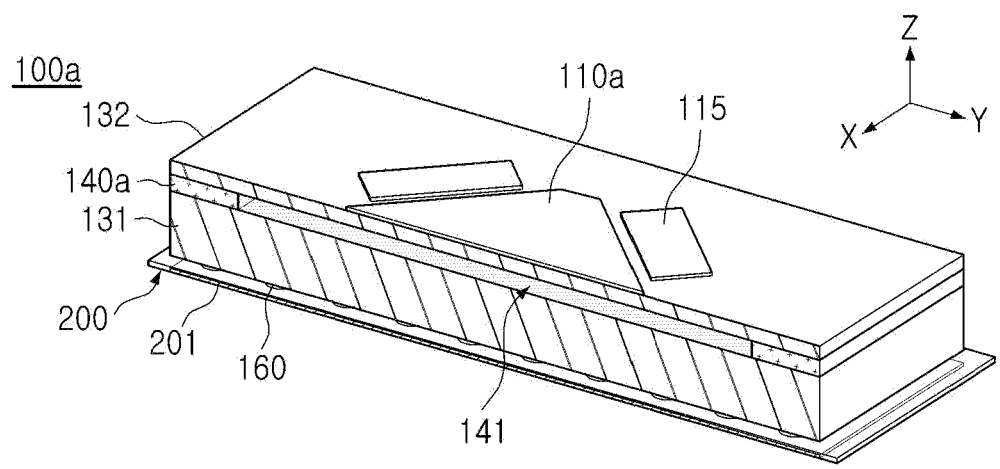
FIGS. 5A and 5B are cross-sectional views illustrating the chip antenna of FIG. 1A, according to an embodiment.
Figure 5B:
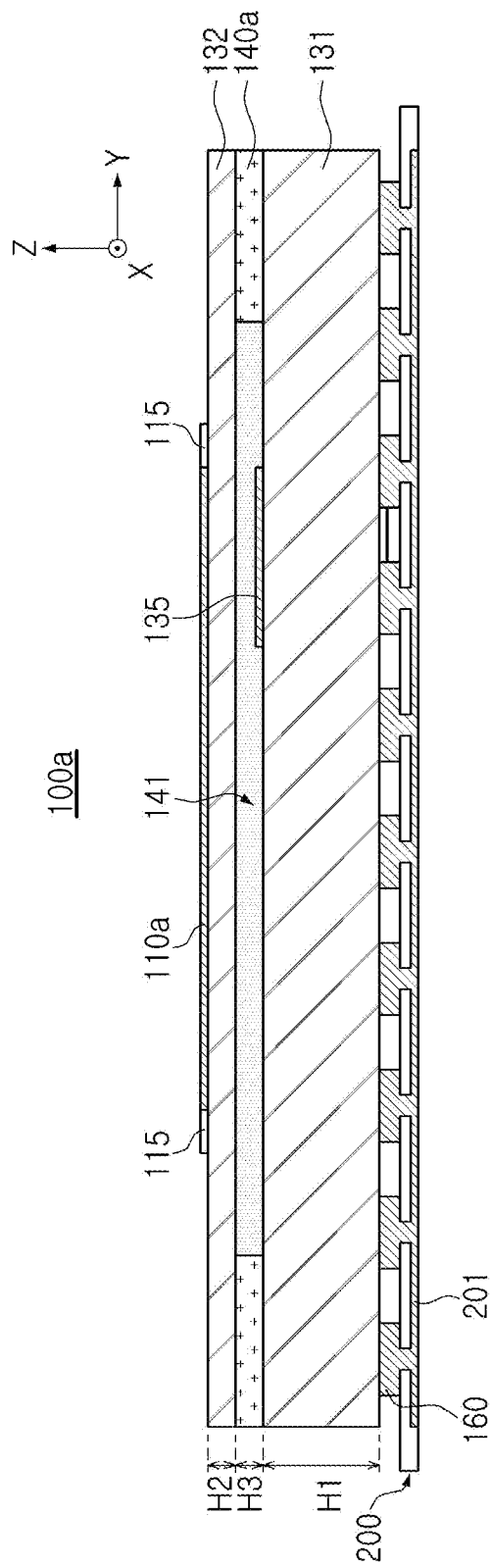

FIG. 1A is a lateral view illustrating a dispositional level of each element in a chip antenna 100a, according to an embodiment. FIG. 2A is a perspective view illustrating an adhesive layer and a vent of the chip antenna 100a, according to an embodiment. FIG. 2B is a perspective view illustrating an appearance of the chip antenna 100a, according to an embodiment. FIG. 2C is a perspective view illustrating a feed pattern and a feed via of the chip antenna 100a, according to an embodiment. FIGS. 5A and 5B are cross-sectional views illustrating the chip antenna 100a, according to an embodiment.

Referring to FIGS. 1A, 2A, 2B, 2C, 5A, and 5B, the chip antenna 100a may include, for example, a first dielectric layer 131, a second dielectric layer 132, a patch antenna pattern 110a, a feed via 120, a feed pattern 135, and an adhesive layer 140a.

Each of the first and second dielectric layers 131 and 132 may include a dielectric medium having a dielectric constant higher than that of air. For example, the first and second dielectric layers 131 and 132 may be formed of a ceramic, such that the first and second dielectric layers 131 and 132 may have a dielectric constant higher than that of an insulating layer (e.g., prepreg) of a substrate 200 on which the chip antenna 100a is disposed.

The chip antenna 100a may be separately manufactured with respect to the substrate 200, which provides a dispositional space for the chip antenna 100a, and may be disposed on a structure of the substrate 200. Accordingly, the first and second dielectric layers 131 and 132 may be formed of a material different from a material of an insulating layer of the substrate 200, and may be implemented by a greater variety of methods than the methods for forming the insulating layer.

For example, the first and second dielectric layers 131 and 132 may be formed of a material having a relatively high dielectric constant such as a ceramic material such as low temperature co-fired ceramic (LTCC) or a glass material, or a material such as Teflon, and may further include any one or any combination of any two or more of magnesium (Mg), silicon (Si), aluminum (Al), calcium (Ca), and titanium (Ti), thereby having a higher dielectric constant and improved durability. For example, the first and second dielectric layers 131 and 132 may include $Mg_2SiO_4$, $MgAlO_4$, and $CaTiO_3$.

The higher the dielectric constant of the first and second dielectric layers 131 and 132, the shorter the wavelength of a radio frequency (RF) signal transmitted or propagated around the first and second dielectric layers 131 and 132 may be. The shorter the wavelength of an RF signal, the more the sizes of the first and second dielectric layers 131 and 132 may be reduced, and a size of the chip antenna 100a may be reduced.

The smaller the size of the chip antenna 100a, the higher the number of the chip antennas 100a disposed in a unit volume may be. The higher the number of the chip antennas 100a disposed in a unit volume, the greater the overall gain and/or maximum output of the plurality of chip antennas 100a for a unit volume may increase.

Thus, the higher the dielectric constant of the first and second dielectric layers 131 and 132, the more the performance of the chip antenna 100a for a particular size of the chip antenna 100a may effectively improve.

The first and second dielectric layers 131 and 132 may be spaced apart from each other. Accordingly, a space between the first and second dielectric layers 131 and 132 may be formed of a medium having a dielectric constant lower than that of air or the first and second dielectric layers 131 and 132.

Accordingly, a space between the first and second dielectric layers 131 and 132 and a boundary surface with the first dielectric layer 131 may form a first dielectric boundary condition, and a space between the first and second dielectric layers 131 and 132 and a boundary surface with the second dielectric layer 132 may form a second dielectric boundary condition.

The first and second dielectric boundary conditions may refract an RF signal such that a radiation pattern of the patch antenna pattern 110a may be more concentrated in upward and downward directions (e.g., a Z direction), and gain of the chip antenna 100a may be improved.

The patch antenna pattern 110a may be disposed on the second dielectric layer 132. A relatively wide upper surface of the patch antenna pattern 110a may allow a radiation pattern to be concentrated in upward and downward directions (e.g., a Z direction) such that an RF signal may be remotely transmitted and/or received in upward and downward directions, and an RF signal having a frequency within a bandwidth based on a resonant frequency of the patch antenna pattern 110a may be remotely transmitted and/or received.

For example, the patch antenna pattern 110a may be formed by drying a conductive paste while the second dielectric layer 132 is coated and/or filled with the conductive paste.

The feed via 120 may penetrate through the first dielectric layer 131, and may function as a feeding path of the patch antenna pattern 110a. In other words, the feed via 120 may provide a path in which a surface current flowing in the patch antenna pattern 110a flows when the patch antenna pattern 110a remotely transmits and/or receives an RF signal.

For example, the feed via 120 may have a structure extending in upward and downward directions in the first dielectric layer 131, and may be formed by a process of filling a through-hole, which is formed in the first dielectric layer 131 by a laser, with a conductive material (e.g., copper, nickel, tin, silver, gold, palladium, or the like).

The feed pattern 135 may be disposed between the first and second dielectric layers 131 and 132, may be electrically connected to the feed via 120, and may be spaced apart from the patch antenna pattern 110a. The feed pattern 135 may also function as a feeding path of the patch antenna pattern 110a.

Since the feed pattern 135 and the patch antenna pattern 110a are spaced apart from each other, the patch antenna pattern 110a may be fed in a non-contact manner.

By being fed in a non-contact feeding manner, inductance based on the feed pattern 135 and capacitance formed by the feed pattern 135 and the patch antenna pattern 110a may work as an additional resonant frequency of the patch antenna pattern 110a such that a bandwidth of the patch antenna pattern 110a may widened.

A non-contact feeding space of a general non-contact feeding configuration may cause leakage of energy of radio waves. However, the first and second dielectric boundary conditions formed by the first and second dielectric layers 131 and 132 of the patch antenna pattern 110a may increase electromagnetic coupling concentration between the patch antenna pattern 110a and the feed pattern 135 such that energy loss due to the patch antenna pattern 110a being fed in a non-contact feeding manner may be reduced, and degradation of gain may be reduced.

Accordingly, the chip antenna 100a may have a wide bandwidth and high gain for a size.

The adhesive layer 140a may be disposed between the first and second dielectric layers 131 and 132, and may be adhered to the first and second dielectric layers 131 and 132. Accordingly, a phenomenon in which one of the first and second dielectric layers 131 and 132 is detached may be prevented, and a gap between the first and second dielectric layers 131 and 132 may be stably maintained.

The adhesive layer 140a may have a dielectric constant higher than a dielectric constant of air and lower than the dielectric constant of the first and second dielectric layers 131 and 132. The lower the dielectric constant of the space between the first and second dielectric layers 131 and 132, the more the first and second dielectric boundary conditions of the first and second dielectric layers 131 and 132 may greatly affect an RF signal, the more electromagnetic coupling concentration between the patch antenna pattern 110a and the feed pattern 135 may further increase, and the more concentrated a radiation pattern of the patch antenna pattern 110a may be in upward and downward directions.

When a dielectric constant of at least a portion of a space between the first and second dielectric layers 131 and 132 is lower than that of the adhesive layer 140a, a bandwidth and gain for a particular size of the patch antenna pattern 110a may be improved.

Accordingly, as shown in FIGS. 2A and 2C, the adhesive layer 140a may have a cavity 141 surrounding the feed pattern 135, and the cavity 141 may include a dielectric medium (e.g., air) having a dielectric constant lower than a dielectric constant of the adhesive layer 140a such that a bandwidth and gain of the patch antenna pattern 110a for a particular size may be improved.

Since a size and a shape of the cavity 141 may affect a resonant frequency or performance of the chip antenna 100a, the chip antenna 100a may have a structure which may reduce a phenomenon in which a size or a shape of the cavity 141 is beyond a designed size and shape in a manufacturing process, thereby obtaining stable performance.

Also, as the adhesive layer 140a forms the cavity 141, the adhesive layer 140a may have a reduced width W1 in comparison to a configuration in which a cavity is not formed by an adhesive layer. Accordingly, the adhesive layer 140a may have structural stability relatively that is lower than that of an example in which the cavity 141 is not provided. Thus, the chip antenna 100a may have a structure that may reduce factors that may physically affect the adhesive layer 140a in a manufacturing process, thereby stably obtaining performance.

Accordingly, the adhesive layer 140a may have a vent 142a disposed between the cavity 141 and an external side surface of the adhesive layer 140a.

For example, when the first and second dielectric layers 131 and 132 are adhered to the adhesive layer 140a in a process of manufacturing the chip antenna 100a, the chip antenna 100a may be subjected to stress causing changes in a volume of the cavity 141, and the stress may distort a size or a shape of the cavity 141 or may cause cracks in the first and second dielectric layers 131 and 132.

The vent 142a may provide an air path through which air of the cavity 141 may flow when the chip antenna 100a is subjected to stress causing changes in volume of the cavity 141 such that the stress affecting the chip antenna 100a may be reduced.

Accordingly, the chip antenna 100a may reduce a phenomenon in which a size or a shape of the cavity 141 is beyond a designed size and shape in a manufacturing process, or a factor physically affecting the adhesive layer 140a may be reduced, thereby stably obtaining improved performance (a bandwidth and gain for a size) based on the cavity 141.

For example, the adhesive layer 140a may include a polymer having an adhesiveness greater than that of a dielectric material of the first and second dielectric layers 131 and 132. As adhesive polymer may have fluid properties as compared to a ceramic structure, factors causing instability in a size and a shape of the cavity 141 may occur. However, because the chip antenna 100a includes the vent 142a, the cavity 141 of the adhesive layer 140a may be stably included, even though the adhesive layer 140a includes an adhesive polymer having fluid properties.

For example, one external side surface of the adhesive layer 140a, one side surface of the first dielectric layer 131, and one side surface of the second dielectric layer 132 may be configured to form one plane. In other words, the chip antenna 100a may have a shape in which a side surface of the structure of the chip antenna 100a is cut out from a structure in which the adhesive layer 140a is adhered to the first and second dielectric layers 131 and 132.

Accordingly, the vent 142a may be more stably formed, and an air moving path of the cavity 141 may be more stably provided. Also, when a plurality of chip antennas 100a are manufactured together, the vent 142a may also function as an air flow path between the cavities 141 of the plurality of chip antennas 100a.

For example, a width W2 (e.g., a length in a Y direction) of the vent 142a may be shorter than a length L1 (e.g., in the Y direction) of a structure surrounding the cavity 141 and shorter than the width W1 (e.g., in an X direction) of the adhesive layer 140a. Accordingly, a phenomenon in which an RF signal leaks in a horizontal direction may be prevented such that gain of the chip antenna 100a may improve in the example embodiment.

For example, the vent 142a may include a plurality of vents 142a, and at least two vents 142a among the plurality of vents 142a may be disposed to overlap each other in a venting direction (e.g., the X direction and/or a the Y direction) of the at least two vents 142a.

Accordingly, air flowing efficiency of the plurality of vents 142a for particular widths W2 of the plurality of vents 142a may improve, and the chip antenna 100a may stably obtain high gain. Also, an overlapping structure of the pairs of vents 142a may be more efficiently implemented when the plurality of chip antennas 100a are manufactured together.

For example, the patch antenna pattern 110a may have a shape of a quadrangle with chamfered corners, and a side of the quadrangle may be disposed to be diagonal to a side of the cavity 141. Additionally, chamfered corners among the chamfered corners, may be disposed to respectively overlap corresponding vents 142a in a venting direction of the corresponding vents 142a.

A surface current flowing in the patch antenna pattern 110a may flow from one side of the quadrangle towards the an opposing side of the quadrangle, and electromagnetic interference between the plurality of chip antennas 100a may further increase when directions of surface currents of the plurality of chip antennas 100a overlap each other. When a side of the quadrangle of the patch antenna pattern 110a is diagonal to a side of the cavity 141, electromagnetic interference applied by a surface current of the patch antenna pattern 110a to an adjacent chip antenna may be prevented.

The chamfered shape of the quadrangle of the patch antenna pattern 110a may allow a corner of the patch antenna pattern 110a to be disposed closer to a central portion of the chip antenna 100a, such that the corner does not extend beyond the cavity 141. Accordingly, electromagnetic coupling concentration between the patch antenna pattern 110a and the feed pattern 135 may improve.

For example, as shown in FIG. 2B, the chip antenna 100a may further include a plurality of coupling patterns 115 disposed on the second dielectric layer 132 and arranged to surround sides of the quadrangle of the patch antenna pattern 110a along the sides.

Since the plurality of coupling patterns 115 may be electromagnetically coupled to the patch antenna pattern 110a, the plurality of coupling patterns 115 may contribute to addition of a resonant frequency and expansion of a bandwidth of the patch antenna pattern 110a, and may form capacitance with the feed pattern 135. Accordingly, a bandwidth of the patch antenna pattern 110a may be effectively expanded.

Capacitance formed by the plurality of coupling patterns 115 and the patch antenna pattern 110a with the feed pattern 135 may be accurately adjusted according to adjustment of a length of the feed pattern 135.

The patch antenna pattern 110a and the plurality of coupling patterns 115 may be disposed on the same level (e.g., at a same height in the Z direction) on an upper surface of the second dielectric layer 132. A relatively high dielectric constant of the second dielectric layer 132 may widen a range of adjustment of capacitance formed by the plurality of coupling patterns 115 and the patch antenna pattern 110a with the feed pattern 135. Accordingly, the chip antenna 100a may effectively widen a bandwidth, and may have a widened bandwidth for a particular size.

As shown in FIG. 2C, the feed pattern 135 may extend in a diagonal direction with respect to a side of the cavity 141. Accordingly, a range of adjustment of a length of the feed pattern 135 may be widened, and the chip antenna 100a may effectively widen a bandwidth, and may have a widened bandwidth for a particular size of the chip antenna 100a.

At least one portion of the feed pattern 135 may be plated to prevent oxidation caused by being in contact with air for an extended period of time, but the disclosure is not limited to the feed pattern 135 being plated.

The chip antenna 100a in the example embodiment may further include a soldering pattern 160 (see FIGS. 1A, 2B, 5A, and 5B) disposed on a lower surface of the first dielectric layer 131 and configured to surround the feed via 120. Accordingly, the chip antenna 100a may be stably mounted on the substrate 200 providing a dispositional space of the chip antenna 100a. The soldering pattern 160 may be electrically connected to a ground plane 201 of the substrate 200.

For example, the soldering pattern 160 may be configured to be advantageous to coupling with solder based on tin (Sn) having a relatively low melting point, and may include a tin plated layer and/or a nickel plated layer such that the coupling with the solder may be easily performed. Also, the soldering pattern 160 may have a structure in which a plurality of cylinders are arranged, but the soldering pattern 160 is not limited to this example.

As shown in FIG. 1A, a first height H1 (e.g., in the Z direction) of the first dielectric layer 131 may be greater than a second height H2 (e.g., in the Z direction) of the second dielectric layer 132, and may be greater than a third height H3 (e.g., in the Z direction) of the adhesive layer 140a, but the disclosure is not limited to this example.

Figure 1B:
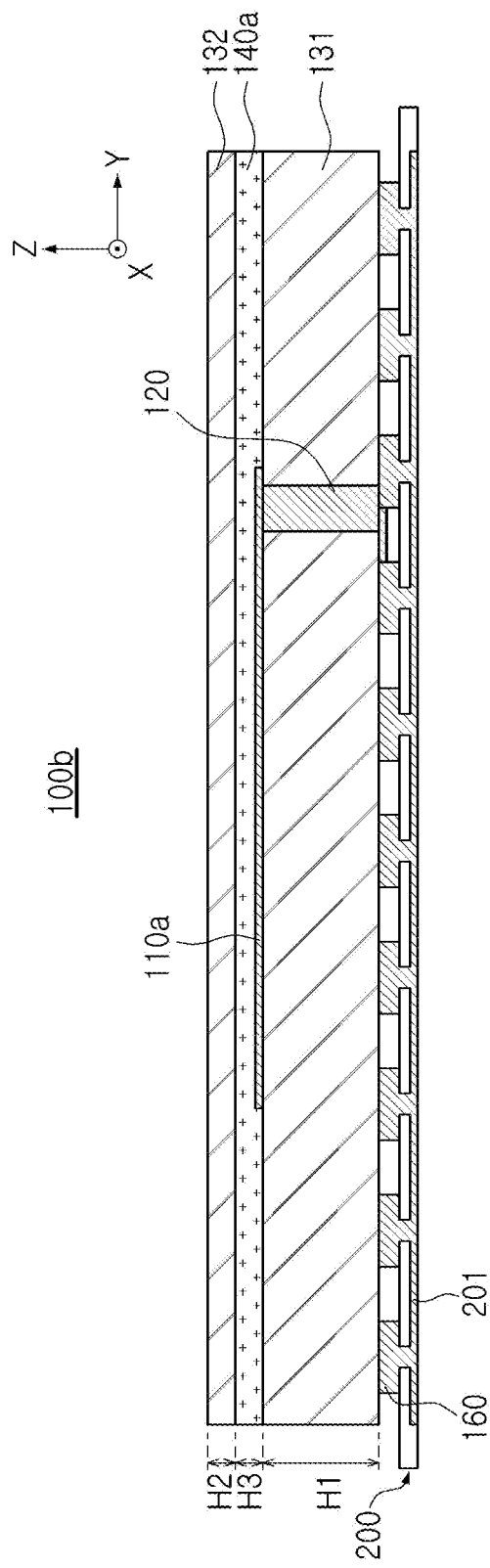
FIG. 1B is a lateral view illustrating disposition of a patch antenna pattern of a chip antenna downwardly, according to an embodiment.
Figure 2D:
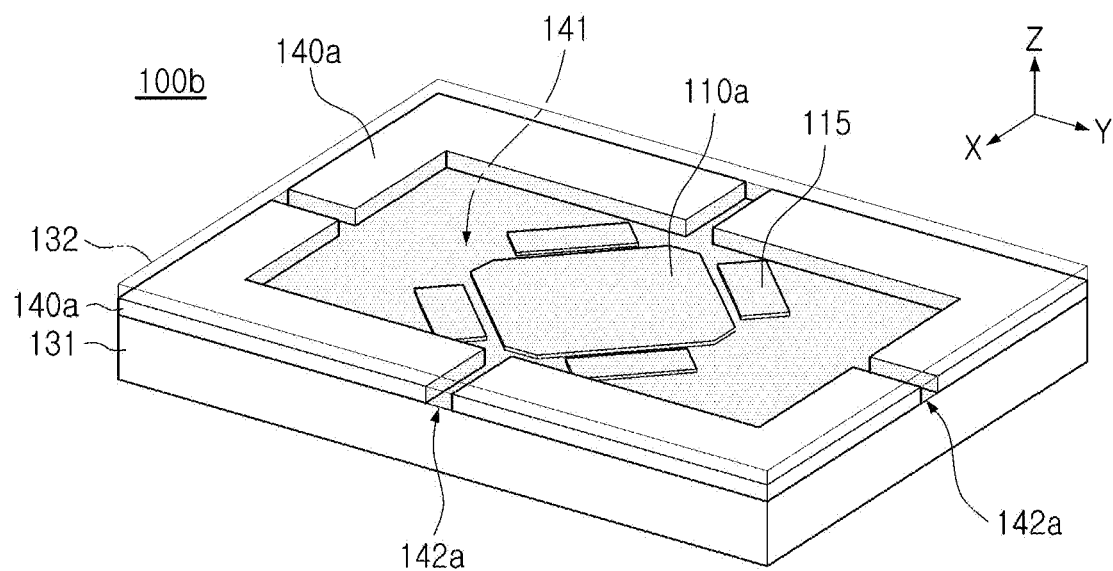
FIG. 2D is a perspective view illustrating downward disposition of a patch antenna pattern of the chip antenna of FIG. 1B, according to an embodiment.

FIG. 1B is a lateral view illustrating downward disposition of the patch antenna pattern 110a of a chip antenna 100b, according to an embodiment. FIG. 2D is a perspective view illustrating downward disposition of the patch antenna pattern 110a of the chip antenna 100b, according to an example embodiment.

Referring to FIGS. 1B and 2D, the chip antenna 100b may have, for example, a structure in which the patch antenna pattern 110a and/or the plurality of coupling patterns 115 are disposed between the first and second dielectric layers 131 and 132.

The patch antenna pattern 110a may be electrically connected to the feed via 120. Accordingly, the chip antenna 100b may be fed in a contact manner.

A dielectric boundary condition between the cavity 141 and the second dielectric layer 132 may refract an RF signal such that a radiation pattern of the patch antenna pattern 110a may be concentrated in upward and downward directions (e.g., the Z direction).

A boundary surface between the adhesive layer 140a and the cavity 141 may surround the patch antenna pattern 110a, and may refract an RF signal. Accordingly, a radiation pattern of the patch antenna pattern 110a may be concentrated in upward and downward directions (e.g., the Z direction), and gain of the chip antenna 100b may be improved.

The chip antenna 100b may include the vent 142a such that the cavity 141 may be stably provided, and a dielectric boundary condition between the cavity 141 and the second dielectric layer 132 may be stably maintained. Accordingly, improved performance based on the cavity 141 may be stably obtained.

At least a portion of each of the patch antenna pattern 110a and the plurality of coupling patterns 115 may be plated to prevent oxidation caused by being in contact with air for a long period of time, but the patch antenna pattern 110a and he coupling patterns 115 are not limited to being plated.

Figure 3A:
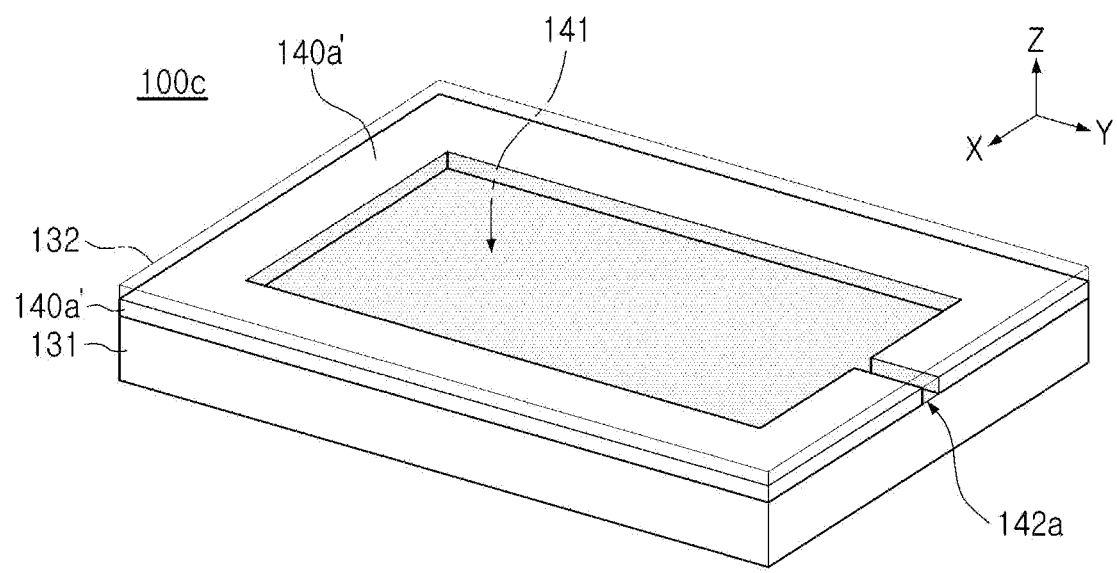
FIGS. 3A and 3B are perspective views illustrating adhesive layers of chip antennas, according to embodiments.
Figure 3B:
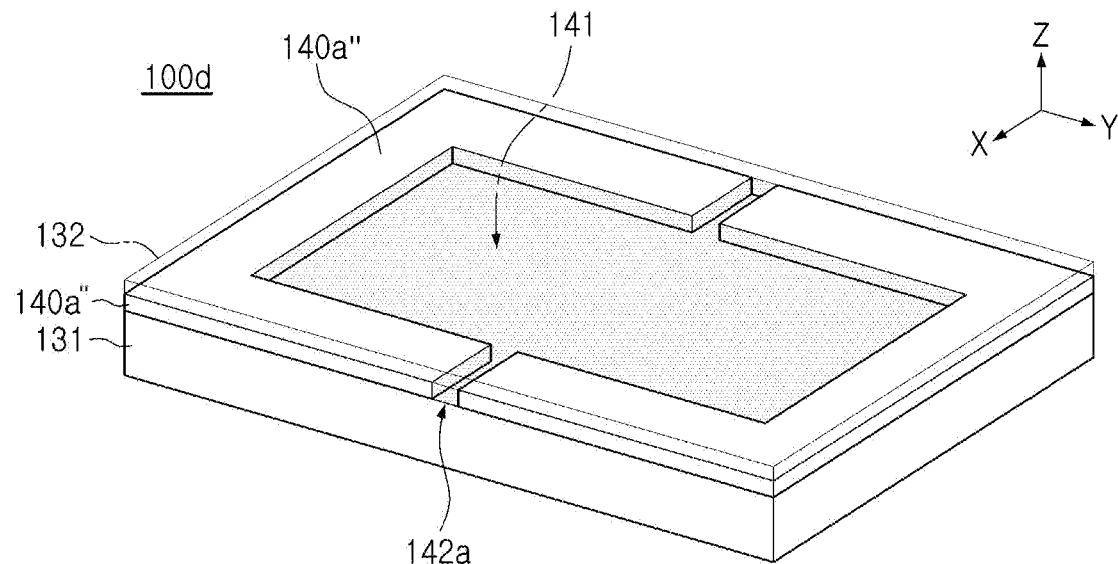

FIGS. 3A and 3B are perspective views illustrating adhesive layers 140a' and 140a" of chip antennas 100c and 100d, respectively, according to embodiments.

Referring to FIG. 3A, the chip antenna 100c may include, for example, the adhesive layer 140a', which includes a single vent 142a.

Referring to FIG. 3B, the chip antenna 100d may have the adhesive layer 140a" including two vents 142a.

Figure 4A:
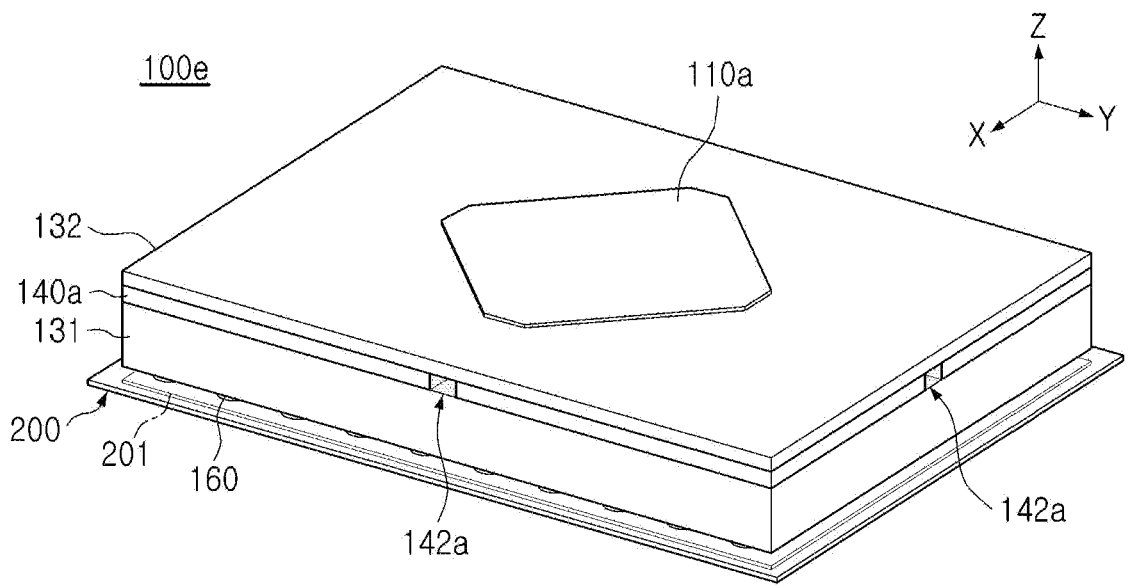
FIGS. 4A and 4B are perspective views illustrating patch antenna patterns of chip antennas, according to embodiments.
Figure 4B:
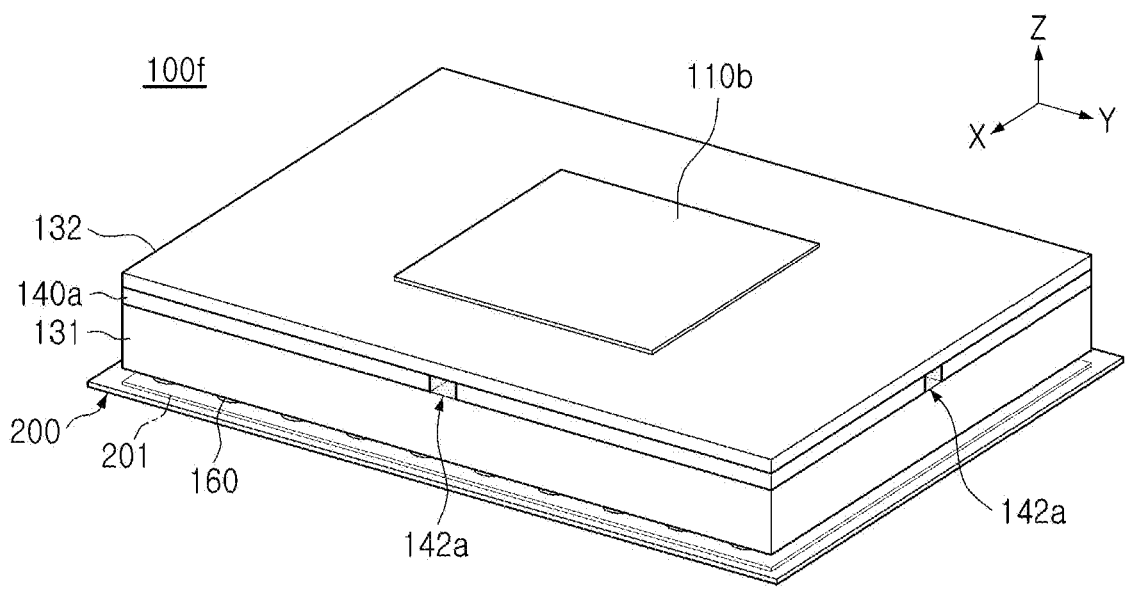

FIGS. 4A and 4B are perspective views illustrating patch antenna patterns 110a and 110b of a chip antennas 100e and 100f, respectively, according to embodiments.

Referring to FIG. 4A, the chip antenna 100e may have, for example, a structure in which the plurality of coupling patterns 155 illustrated in FIG. 2B are not included.

Referring to FIG. 4B, in the chip antenna 100f, the quadrangle of the patch antenna pattern 110b does not include the chamfered corners included in the patch antenna pattern 110a illustrated in FIG. 2B, and the chip antenna 100f may be rotated in a horizontal direction (e.g., about the Z axis) by 45 degrees.

Figure 6A:
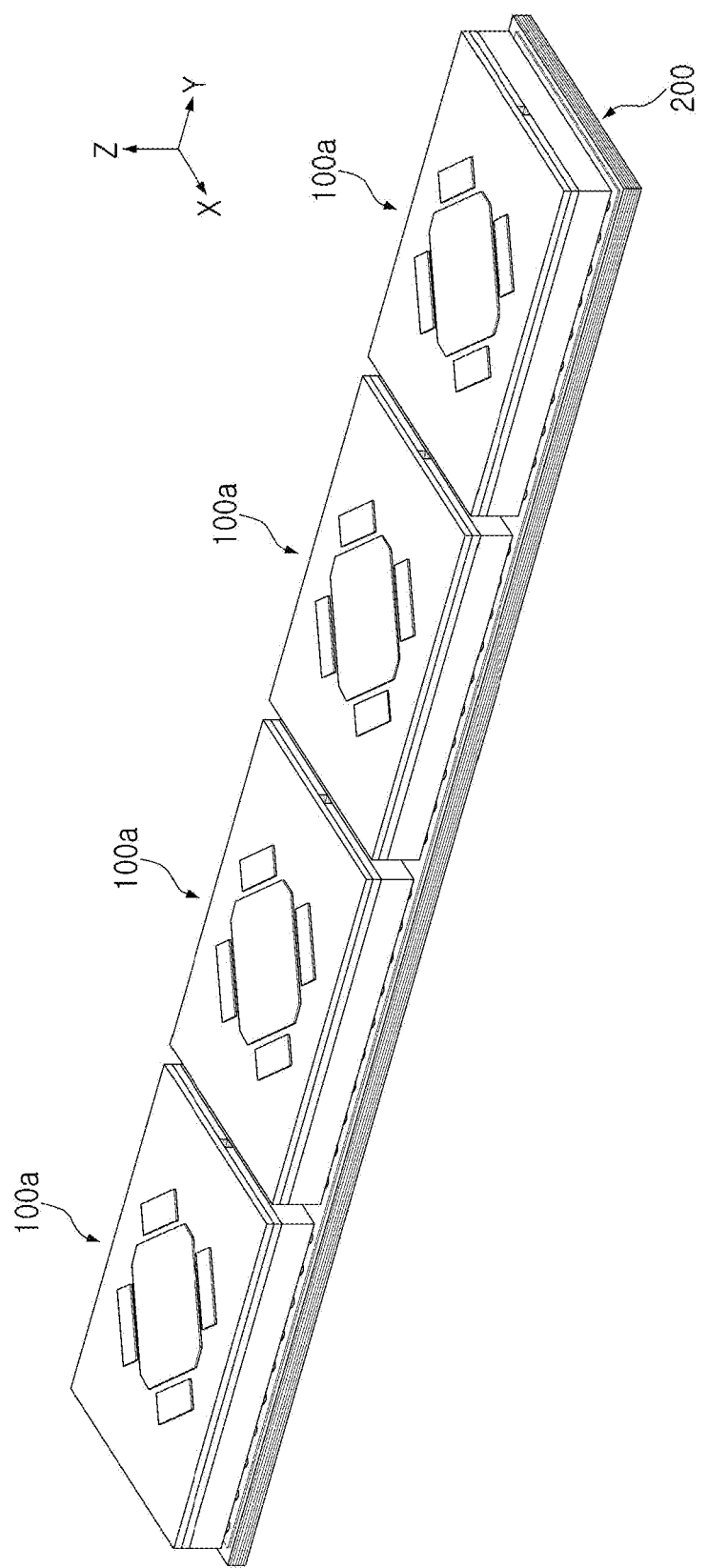
FIG. 6A is a perspective view illustrating arrangement of a plurality of chip antennas, according to an embodiment.

FIG. 6A is a perspective view illustrating arrangement of a plurality of chip antennas 100a, according to an embodiment.

Referring to FIG. 6A, the plurality of chip antennas 100a may be arranged in a single column on the substrate 200 and may be spaced apart from each other.

Figure 6B:
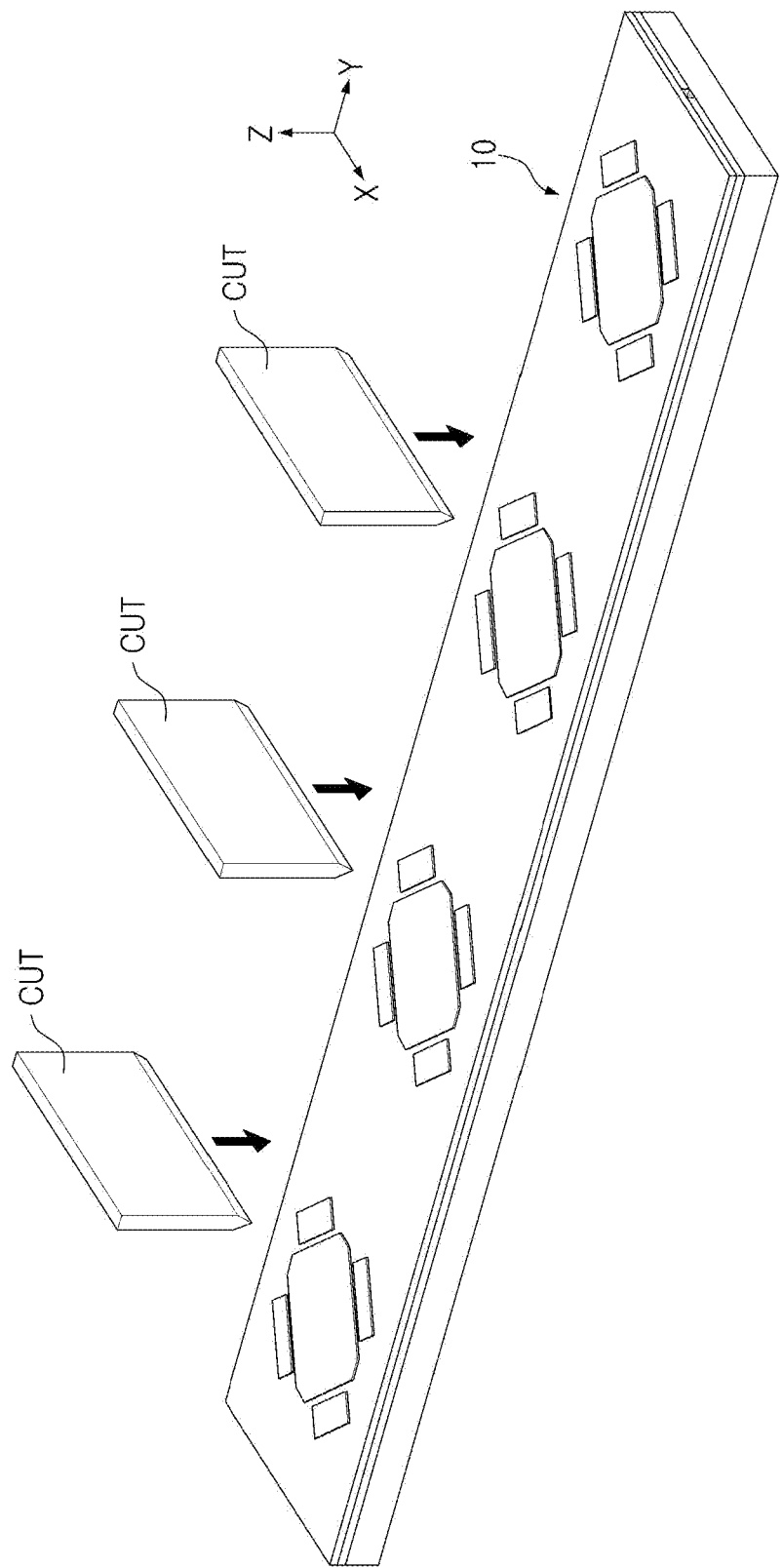
FIG. 6B is a perspective view illustrating a lateral-surface cutting process included in a process of manufacturing a chip antenna, according to an embodiment.

FIG. 6B is a perspective view illustrating a lateral-surface cutting process of a process of manufacturing a chip antenna, according to an embodiment.

Referring to FIG. 6B, the chip antenna may be manufactured by cutting a structure 10, in which a first dielectric layer, an adhesive layer, and a second dielectric layer are stacked, by a cut-out means. Accordingly, in the chip antenna, one external side surface of the adhesive layer, one side surface of the first dielectric layer, and one side surface of the second dielectric layer may be configured to form one plane.

However, in another example, chip antennas may be separately manufactured one-by-one.

Figure 7A:
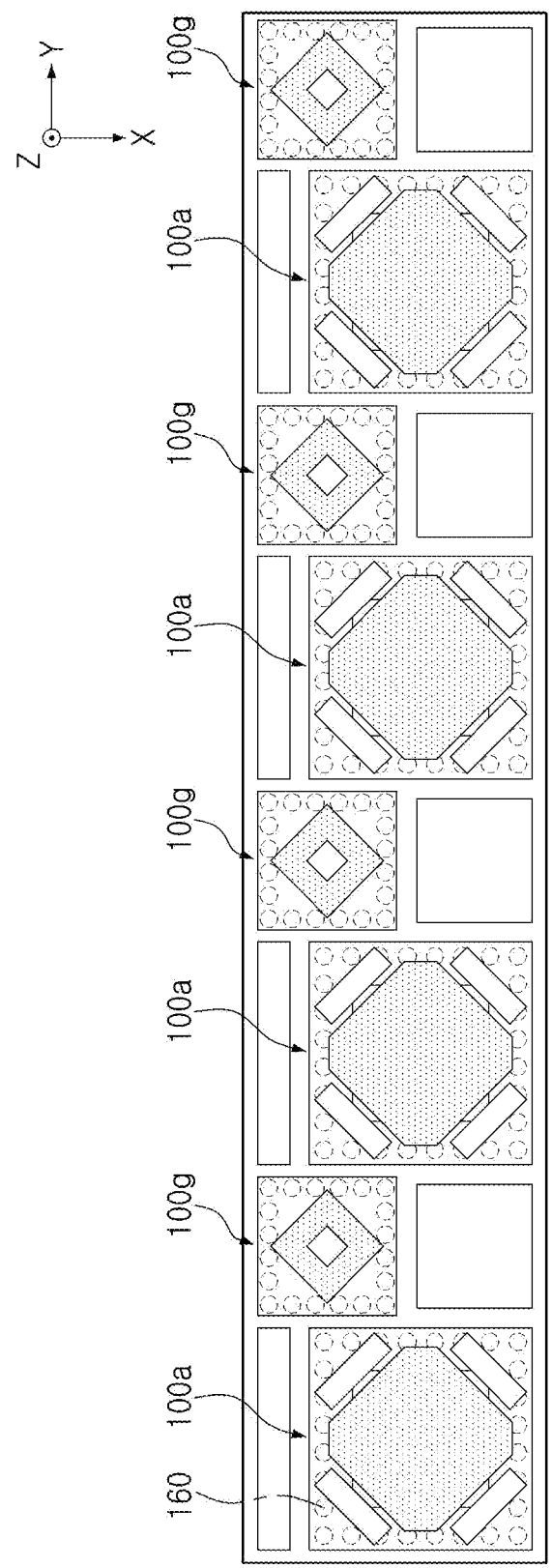
FIG. 7A is a plan view illustrating an arrangement of chip antennas, according to an embodiment.
Figure 7B:
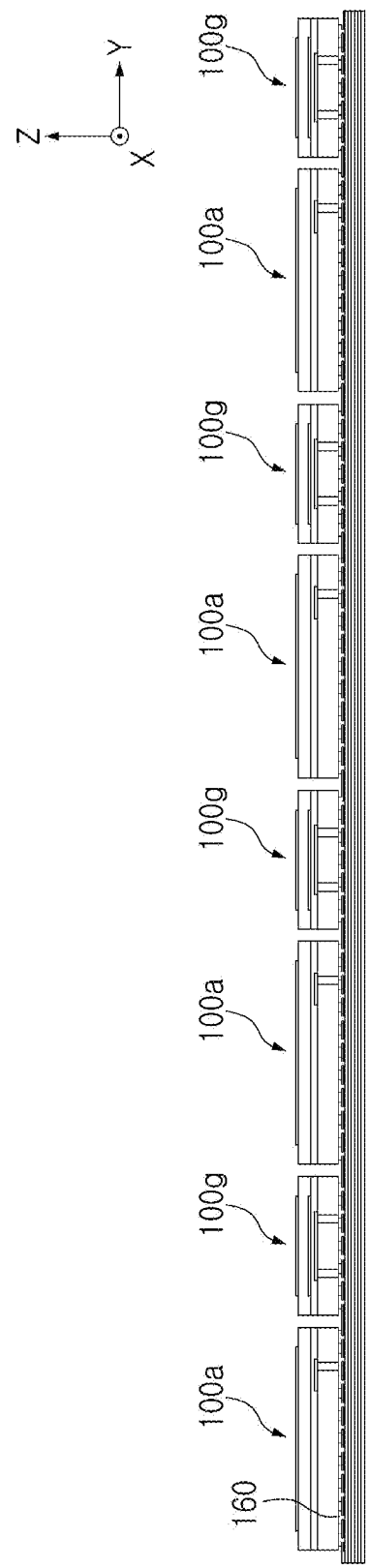
FIG. 7B is a lateral view illustrating the arrangement of a chip antennas of FIG. 7B, according to an embodiment.

FIG. 7A is a plan view illustrating an arrangement of chip antennas 100a and 100g, according to an embodiment. FIG. 7B is a lateral view illustrating the arrangement of a chip antennas of FIG. 7A.

Referring to FIGS. 7A and 7B, the chip antennas 100a may, for example, be arranged in alternating order with the second chip antennas 100g.

The second chip antennas 100g may have a size smaller than a size of the chip antennas 100a, and may be configured to have a second bandwidth of a minimum frequency higher than a maximum frequency of a first bandwidth of the chip antennas 100a.

The second chip antenna 100g may include a first dielectric layer, a second dielectric layer, a patch antenna pattern, a feed via, an adhesive layer, a cavity, and a vent, as described herein with reference to FIGS. 1A to 6B.

Figure 8A:
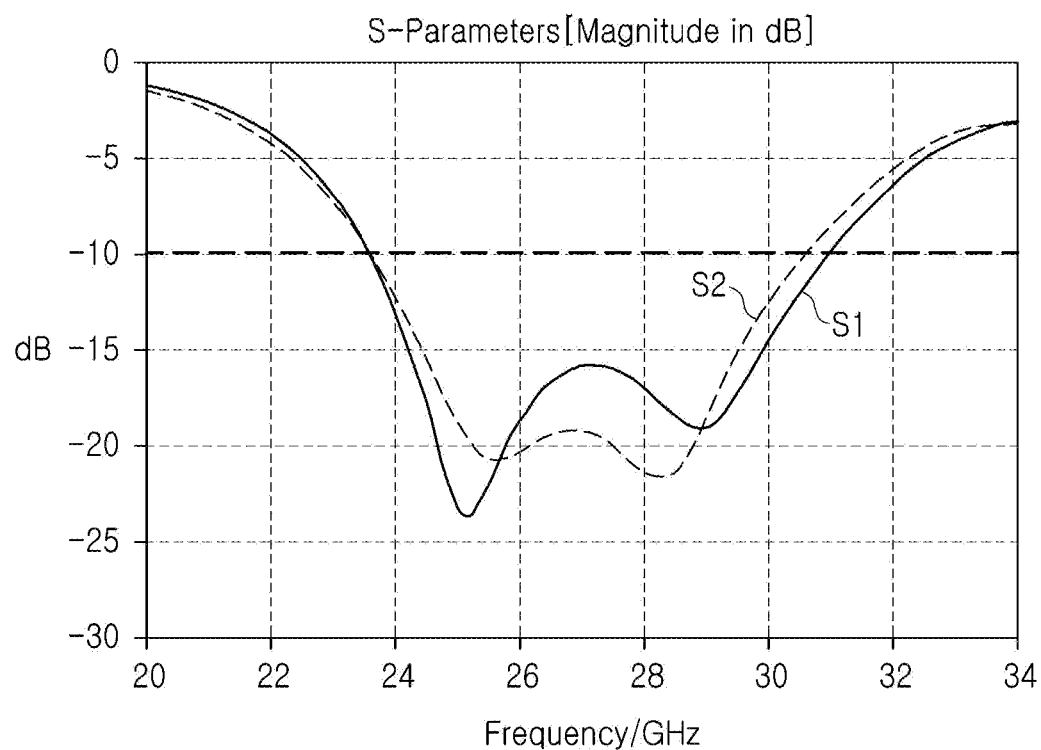
FIG. 8A is a graph illustrating changes in an S-parameter according to whether a chip antenna includes a cavity, according to an embodiment.

FIG. 8A is a graph illustrating changes in an S-parameter according to whether a chip antenna includes a cavity (e.g., the cavity formed by an adhesive layer 140a, 140a', or 140a"), according to an embodiment.

Referring to FIG. 8A, a first curve S1 indicates an S-parameter (reflective energy) between first ports of a chip antenna of according to an embodiment including the cavity, and a second curve S2 indicates an S-parameter (reflective energy) between first ports of a chip antenna that does not include the cavity.

When a frequency range in which an S-parameter is 10 dB or lower is defined as a bandwidth, a bandwidth (7.4 GHz) of the first curve S1 may be widened further than a bandwidth (7.0 GHz) of the second curve (S2) by about 5%.

Accordingly, the chip antenna of the embodiment including the cavity may have a widened bandwidth by including the cavity.

Figure 8B:
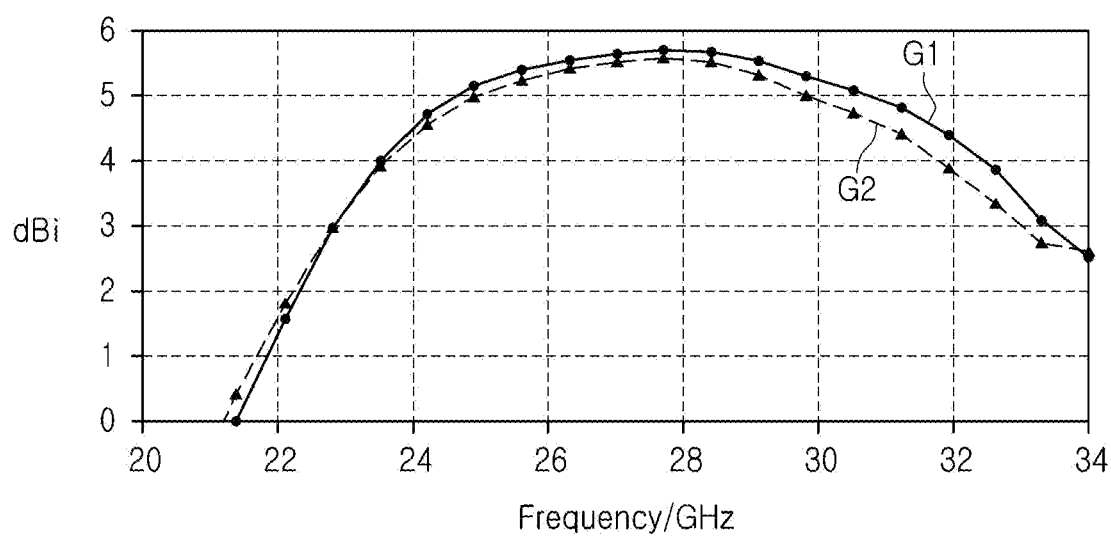
FIG. 8B is a graph illustrating changes in gain according to whether a chip antenna includes a cavity, according to an embodiment.

FIG. 8B is a graph illustrating changes in gain according to whether a chip antenna includes a cavity (e.g., the cavity formed by an adhesive layer 140a, 140a', or 140a"), according to an embodiment.

Referring to FIG. 8B, a third curve G1 indicates gain of a chip antenna according to an embodiment including the cavity, and a fourth curve G2 indicates gain of a chip antenna that does not include the cavity. A gain obtained at each main frequency is indicated below in Table 1.

TABLE 1

| | Frequency (GHz) | | | | | | |
|---|---|---|---|---|---|---|---|
| | 24.25 | 25 | 26 | 27 | 28 | 29 | 29.5 | Average |
| G1(dBi) | 4.76 | 5.2 | 5.49 | 5.65 | 5.71 | 5.58 | 5.42 | 5.40 |
| G2(dBi) | 4.6 | 5.0 | 5.35 | 5.54 | 5.58 | 5.36 | 5.16 | 5.22 |

Referring to Table 1, an average gain (5.40 dBi) of the third curve G1 greater than an average gain (5.22 dBi) of the fourth curve G2 by about 4%. In other words, the chip antenna according to embodiment including the cavity may have a higher gain by including the cavity.

Figure 9A:
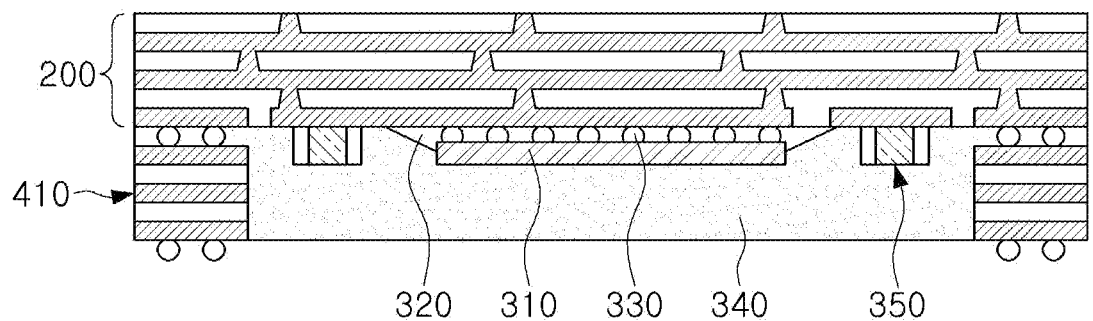
FIGS. 9A and 9B are lateral views illustrating substrates providing a mounting space for a chip antenna, according to embodiments.
Figure 9B:
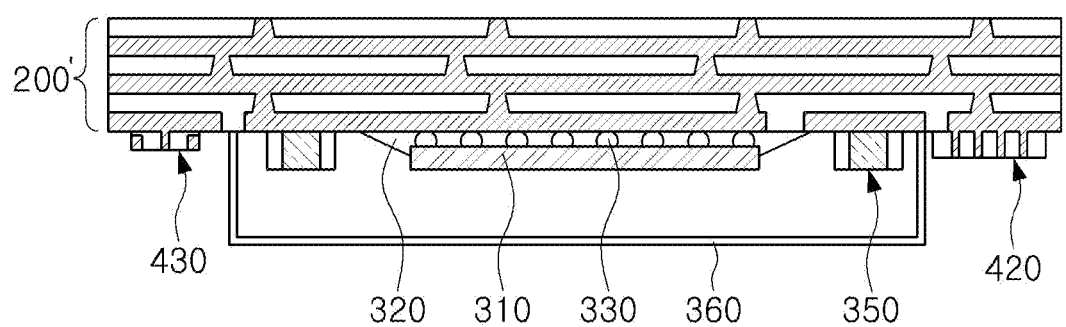

FIGS. 9A and 9B are lateral views illustrating substrates providing a mounting space for a chip antenna, according to embodiments.

Referring to FIG. 9A, the substrate 200, on which a chip antenna is mounted, may provide a dispositional space for any one or any combination of any two or more of an IC 310, an adhesive member 320, an electrical connection structure 330, an encapsulant 340, a passive component 350, and a core member 410.

The IC 310 may be disposed on a lower side of the substrate 200, and may perform any one or any combination of ay two or more of conversion of a frequency with respect to an RF signal remotely transmitted from the chip antenna and/or remotely received in the chip antenna, amplification filtering, phase control, and power generation. The IC 310 may be electrically connected to a wiring of the substrate 200 and may transmit an RF signal or may receive an RF signal, and may be electrically connected to a ground plane of the substrate 200 and may be provided with ground.

The adhesive member 320 may adhere the IC 310 to the substrate 200.

The electrical connection structure 330 may electrically connect the IC 310 to the substrate 200. For example, the electrical connection structure 330 may have a structure such as a solder ball, a pin, a land, or a pad. The electrical connection structure 330 may have a melting point lower than a melting point of a wiring and a ground plane of the substrate 200, and may be formed to electrically connect the IC 310 to the substrate 200 through a process using the low melting point.

The encapsulant 340 may encapsulate at least a portion of the IC 310, and may improve heat dissipation performance and protective performance against impact of the IC 310. For example, the encapsulant 340 may be implemented by a photoimageable encapsulant (PIE), an Ajinomoto build-up film (ABF), an epoxy molding compound (EMC), or the like.

The passive component 350 may be disposed on a lower surface of the substrate 200, and may be electrically connected to a wiring and/or a ground plane of the substrate 200. For example, the passive component 350 may include at least a portion of a capacitor (e.g., a multilayer ceramic capacitor (MLCC) or an inductor, and a chip resistor.

The core member 410 may be disposed on a lower side of the substrate 200. The core member 410 may be electrically connected to the substrate 200 and configured to receive an intermediate frequency (IF) signal or a base band signal from an external entity and transfer the signal to the IC 310, or receive an IF signal or a baseband signal from the IC 310 and to transfer the signal to an external entity. A frequency (e.g., 24 GHz, 28 GHz, 36 GHz, 39 GHz, and 60 GHz) of an RF signal may be higher than a frequency (2 GHz, 5 GHz, 10 GHz, or the like) of an IF signal.

For example, the core member 410 may transfer an RF signal or a baseband signal to the IC 310 or may receive the signal from the IC 310 through a wiring included in an IC ground plane of the substrate 200.

Referring to FIG. 9B, a substrate 200', on which a chip antenna is mounted, may include at least a portion of a shielding member 360, a connector 420, and an end-fire chip antenna 430.

The shielding member 360 may be disposed on a lower side of the substrate 200' and may be disposed to enclose the substrate 200' along with the IC 310. For example, the shielding member 360 may be disposed to cover (e.g., conformally shield) the IC 310 and the passive component 350 together or may separately cover (e.g., compartmentally shield) the IC 310 and the passive component 350. For example, the shielding member 360 may have a hexahedral shape of which one surface is open, and may have an accommodation space, in which the IC 310 and/or the passive component 350 are disposed, having a hexahedral shape by being coupled to the substrate 200'. The shielding member 360 may be formed of a material having high conductivity, such as copper, such that the shielding member 360 may have a skin depth, and may be electrically connected to a ground plane of the substrate 200'. Accordingly, the shielding member 360 may reduce electromagnetic noise which the IC 310 and the passive component 350 may receive.

The connector 420 may have a connection structure of a cable (e.g., a coaxial cable, a flexible PCB), may be electrically connected to an IC ground plane, and may perform functions similar to those of the core member 410. In other words, the connector 420 may be provided with an IF signal, a baseband signal, and/or power from a cable, or may provide an IF signal and/or a baseband signal to a cable.

The end-fire chip antenna 430 may transmit or receive an RF signal in addition to a chip antenna module in the example embodiment. For example, the end-fire chip antenna 430 may include a dielectric block having a dielectric constant higher than that of an insulating layer, and a plurality of electrodes disposed on both surfaces of the dielectric block. One of the plurality of electrodes may be electrically connected to a wiring of the substrate 200', and another one the plurality of electrodes may be electrically connected to a ground plane of the substrate 200'.

Figure 10:
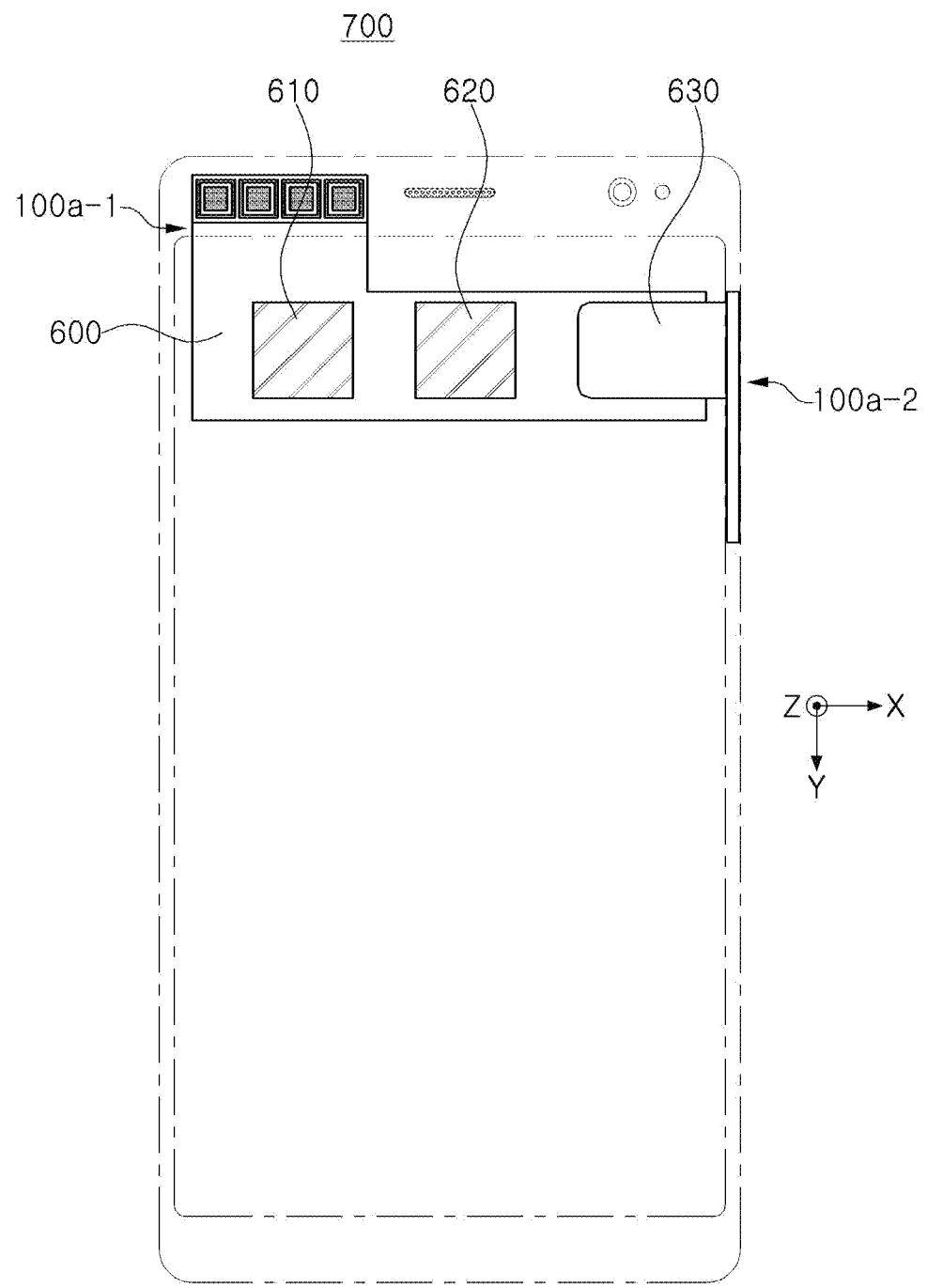
FIG. 10 is a plan view illustrating an electronic device in which chip antenna assemblies are arranged on a base substrate, according to an embodiment.

FIG. 10 is a plan view illustrating an electronic device 700 in which chip antenna assemblies 100a-1 and 100a-2 are arranged on a base substrate 600, according to an embodiment.

Referring to FIG. 10, the chip antenna assemblies 100a-1 and 100a-2 may be respectively disposed adjacent to different edges of the electronic device 700. The chip antenna assembly 100a-1 may be disposed on the base substrate 600. The chip antenna assembly 100a-2 may be disposed on a connector or a secondary substrate 630 that is mounted on the base substrate 600.

The electronic device 700 may be, for example, a smartphone, a personal digital assistant, a digital video camera, a digital still camera, a network system, a computer, a monitor, a tablet PC, a laptop PC, a netbook PC, a television, a video game, a smart watch, an automotive component, or the like. However, the electronic device 700g is not limited to the foregoing examples.

The electronic device 700 may include a base substrate 600, and the base substrate 600 may further include a communications modem 610 and a baseband IC 620 connected to the communications modem 610.

The communications modem 610 may include any one or any combination of any two or more of: a memory chip such as a volatile memory (e.g., a DRAM), a non-volatile memory (e.g., a ROM), a flash memory, or the like; an application processor chip such as a central processor (e.g., a CPU), a graphics processor (e.g., a GPU), a digital signal processor, a cryptographic processor, a microprocessor, a microcontroller, or the like; and a logic chip such as an analog-to-digital converter, an application-specific integrated circuit (ASIC), or the like.

The baseband IC 620 may generate a base signal by performing analog-to-digital conversion, and amplification, filtering, and frequency conversion on an analog signal. A base signal input to and output from the baseband IC 620 may be transferred to the chip antenna assemblies 100a-1 and 100a-2 through a coaxial cable, and the coaxial cable may be electrically connected to an electrical connection structure of the chip antenna assemblies 100a-1 and 100a-2.

For example, a frequency of the base signal may be a baseband, and may be a frequency (e.g., several GHzs) corresponding to an intermediate frequency (IF). A frequency (e.g., 28 GHz or 39 GHz) of an RF signal may be higher than an IF, and may correspond to a millimeter wave (mmWave).

The patterns and the vias described in the aforementioned embodiments may include a metal material (e.g., a conductive material such as copper (Cu), aluminum (Al), silver (Ag), tin (Sn), gold (Au), nickel (Ni), lead (Pb), titanium (Ti), or alloys thereof), and may be formed by a plating method such as a chemical vapor deposition (CVD) method, a physical vapor deposition (PVD) method, a sputtering method, a subtractive method, an additive method, a semi-additive process (SAP), a modified semi-additive process (MSAP), or the like. However, the disclosure herein is not limited to the foregoing example materials and the methods.

The RF signals described in the example embodiments may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the above-mentioned protocols, but the disclosure herein is not limited to the foregoing examples. Also, a frequency (e.g., 24 GHz, 28 GHz, 36 GHz, 39 GHz, or 60 GHz) of the RF signal may be higher than a frequency of an IF signal (e.g., 2 GHz, 5 GHz, 10 GHz, or the like).

According to the embodiments described herein, the chip antenna may have improved antenna performance (e.g., gain, bandwidth, directivity, transmission and reception rates, and the like), may provide stable antenna performance, and may be manufactured with high reliability.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. In addition, respective embodiments may be combined with each other. Therefore, the scope of the disclosure is defined not by the detailed description, but by the claims and their equivalents, and all variations within the scope of the claims and their equivalents are to be construed as being included in the disclosure.

What is claimed is:

1. A chip antenna, comprising:
a first dielectric layer;
a second dielectric layer upwardly spaced apart from the first dielectric layer;
a patch antenna pattern disposed on the second dielectric layer;
a feed via extending through the first dielectric layer;
a feed pattern disposed between the first and second dielectric layers, electrically connected to the feed via, and spaced apart from the patch antenna pattern; and
an adhesive layer adhered to the first and second dielectric layers, and including:
a cavity surrounding the feed pattern between the first and second dielectric layers and; and
a vent disposed between the cavity and an external side surface of the adhesive layer.

2. The chip antenna of claim 1, wherein the adhesive layer includes a polymer having an adhesiveness higher than an adhesiveness of a dielectric material of the first and second dielectric layers.

3. The chip antenna of claim 2, wherein the external side surface of the adhesive layer, a side surface of the first dielectric layer, and a side surface of the second dielectric layer form a single plane.

4. The chip antenna of claim 1, wherein a width of the vent is shorter than a width of a structure surrounding the cavity on the adhesive layer.

5. The chip antenna of claim 4,
wherein the vent includes a plurality of vents, and
wherein at least two vents among the plurality of vents are disposed to overlap each other in a venting direction of the at least two vents.

6. The chip antenna of claim 1, wherein the patch antenna pattern has a quadrangular shape with chamfered corners, and a side of the quadrangular shape is disposed to be diagonal to a side of the cavity.

7. The chip antenna of claim 6, further comprising:
a plurality of coupling patterns disposed on the second dielectric layer and arranged to at least extend adjacent to sides of the quadrangular shape.

8. The chip antenna of claim 7, wherein the patch antenna pattern and the plurality of coupling patterns are disposed on a same level on an upper surface of the second dielectric layer.

9. The chip antenna of claim 1, wherein the patch antenna pattern is disposed on an upper surface of the second dielectric layer.

10. The chip antenna of claim 1, wherein the feed pattern extends in a diagonal direction with respect to a side of the cavity.

11. The chip antenna of claim 1,
wherein at least a portion of the cavity includes air, and
wherein at least a portion of the feed pattern is plated.

12. The chip antenna of claim 1, further comprising:
a soldering pattern disposed on a lower surface of the first dielectric layer and surrounding the feed via.

13. A chip antenna, comprising:
a first dielectric layer;
a feed via extending through the first dielectric layer;
a second dielectric layer upwardly spaced apart from the first dielectric layer;
a patch antenna pattern disposed between the first and second dielectric layers and electrically connected to the feed via; and
an adhesive layer adhered to the first and second dielectric layers, and including:
a cavity surrounding the patch antenna pattern between the first and second dielectric layers; and
a vent disposed between the cavity and an external side surface of the adhesive layer.

14. The chip antenna of claim 13, wherein the adhesive layer includes polymer having an adhesiveness higher than an adhesiveness of a dielectric material of the first and second dielectric layers.

15. The chip antenna of claim 14, wherein the external side surface of the adhesive layer, a side surface of the first dielectric layer, and a side surface of the second dielectric layer form a single plane.

16. The chip antenna of claim 13, wherein a width of the vent is shorter than a width of a structure surrounding the cavity on the adhesive layer.

17. The chip antenna of claim 16,
wherein the vent includes four or more vents, and
wherein the patch antenna pattern has a quadrangular shape with chamfered corners, and the chamfered corners are disposed to overlap corresponding vents, among the four or more vents, in a venting direction of the corresponding vents.

18. The chip antenna of claim 13, wherein the patch antenna pattern has a quadrangular shape having chamfered corners, and a side of the quadrangular shape is disposed to be diagonal to a side of the cavity.

19. The chip antenna of claim 13,
wherein at least a portion of the cavity includes air, and
wherein at least a portion of the patch antenna pattern is plated.

20. The chip antenna of claim 13, further comprising:
a soldering pattern disposed on a lower surface of the first dielectric layer and surrounding the feed via.

21. A chip antenna, comprising:
a first dielectric layer;
a second dielectric layer disposed above the first dielectric layer;
a cavity disposed between the first dielectric layer and the second dielectric layer;
a patch antenna pattern disposed on the second dielectric layer;

a feed pattern disposed in the cavity and configured to feed a signal to or from the patch antenna pattern in a non-contact manner;

an adhesive layer attaching the first dielectric layer and the second dielectric layer to each other, and surrounding the cavity; and a vent extending from the cavity to an external side surface of the adhesive layer.

22. The chip antenna of claim 21, wherein the adhesive layer has a dielectric constant that is lower than a dielectric constant of the first dielectric layer and a dielectric constant of the second dielectric layer.

23. The chip antenna of claim 21, wherein the patch antenna pattern does not extend laterally beyond the cavity.

24. The chip antenna of claim 23, wherein the patch antenna pattern has a quadrangular shape with chamfered corners, and the vent is aligned with one of the chamfered corners.

* * * * *